(12) United States Patent
Fyvie

(10) Patent No.: US 6,973,149 B2
(45) Date of Patent: Dec. 6, 2005

(54) ARRANGEMENT FOR CAPTURING DATA

(75) Inventor: Clifford D. Fyvie, Moray (GB)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 810 days.

(21) Appl. No.: 09/986,460

(22) Filed: Nov. 8, 2001

(65) Prior Publication Data

US 2002/0080899 A1    Jun. 27, 2002

(30) Foreign Application Priority Data

Nov. 10, 2000   (SE) .................................. 0004115

(51) Int. Cl.$^7$ ............................................... H04L 7/06
(52) U.S. Cl. ...................... 375/364; 375/142; 375/376; 375/371; 370/376; 370/574
(58) Field of Search ............................. 375/364, 376, 375/371, 142; 370/524, 376, 574

(56) References Cited

U.S. PATENT DOCUMENTS

| | | | | |
|---|---|---|---|---|
| 5,359,625 A | * | 10/1994 | Vander Mey et al. ....... | 375/142 |
| 5,557,225 A | | 9/1996 | Denham et al. ............ | 327/199 |
| 5,634,042 A | | 5/1997 | Kashiwagi et al. ......... | 713/501 |
| 5,905,734 A | * | 5/1999 | Wille et al. ................. | 370/524 |
| 6,002,685 A | * | 12/1999 | Wille et al. ................. | 370/376 |
| 6,236,696 B1 | * | 5/2001 | Aoki et al. ................. | 375/376 |
| 2004/0161070 A1 | * | 8/2004 | Yin et al. ................... | 375/371 |
| 2005/0008111 A1 | * | 1/2005 | Suzuki ....................... | 375/371 |

FOREIGN PATENT DOCUMENTS

EP          1 063 809 A2   12/2000

* cited by examiner

*Primary Examiner*—Shuwang Liu
*Assistant Examiner*—Eva Zheng
(74) *Attorney, Agent, or Firm*—Nixon & Vanderhye P.C.

(57) ABSTRACT

An arrangement for capturing data from a data stream of a predetermined data transfer rate using a flip-flop, comprises a symmetrical multi-phase clock generator that is adapted to be locked to a reference clock which in turn is adapted to generate a reference clock signal at the data transfer rate or at a fraction thereof. The multi-phase clock generator is adapted to generate "n" clock signals mutually shifted in phase 360°/n from each other. A selector is connected to the clock generator to receive the n clock signals and selects one of these n clock signals as the system clock signal in response to a control signal from a clock phase counter. The clock phase counter is controlled to count up or down in response to the phase of the system clock signal when a predetermined number of data transitions have occurred in the data stream. The flip-flop is controlled by the opposite phase of the system clock signal to capture the data from the data stream.

2 Claims, 2 Drawing Sheets

ARRANGEMENT FOR CAPTURING DATA

TECHNICAL FIELD

The invention relates generally to data reception and more specifically to the capture and resynchronization of data from a high-speed data stream.

BACKGROUND OF THE INVENTION

Today, i.a. the below techniques are used to capture data from a data stream.

Clock Recovery Using a Phase-locked Loop Steered by the Data.

The disadvantage of this technique is that it depends on that data transitions occur at regular intervals. To guarantee this in an arbitrary data stream, extra coding bits must be added which reduces the bandwidth of the real information that can be transmitted in the data stream.

Multiple Sampling of the Data Signal as it Passes Through a Delay Line.

The disadvantage of this technique is that the realization circuitry is complex.

Transmission of Matched Clock and Data Signals.

The disadvantage of this technique is that it places heavy demands on making both the clock path and the data path identical as well as on the transmission medium except when the transmission distances are very short.

The known techniques are unsuited for use in connection with high-speed data streams.

SUMMARY OF THE INVENTION

The object of the invention is to bring about an arrangement that is suitable for use in connection with high-speed data streams.

This is attained by means of the arrangement according to the invention for capturing data from a data stream of a predetermined data transfer rate, comprising a first flip-flop that is adapted to receive the data stream on its data input and a system clock signal on its clock input for clocking captured data to its output, a symmetrical multiphase clock generator that is adapted to be locked to a reference clock which in turn is adapted to generate a reference clock signal at the data transfer rate or at a fraction thereof, the multiphase clock generator being adapted to generate n clock signals mutually shifted in phase 360°/n from each other, a selector that is connected with its input to the multiphase clock generator to receive the n clock signals, the selector being adapted to select, in response to a control signal, one of these n clock signals to be the system clock signal to be supplied to the clock input of the first flip-flop, a dual edge triggered second flip-flop that is connected with its data input to the clock input of the first flip-flop and with its clock input to the data input of the first flip-flop to sample the selected system clock signal by means of the incoming data stream on every data transition thereof to generate on its output a retard clock signal that is high if the selected system clock signal is high when sampled and that is low if the selected system clock signal is low when sampled, a divider that is connected with its input to the data input of the first flip-flop and that is adapted to generate a counter clock signal on its output every time a predetermined number of data transitions has occurred in the data stream, and a clock phase counter that is connected with its input to the output of the dual edge triggered second flip-flop, with its clock input to the output of the divider, and with its output to the selector to control the selector to select another one of said n clock signals to be the system clock signal in response to the retard clock signal being high or low.

Preferably, said counter clock signal is generated every time at least two data transitions has occurred in the data stream.

The arrangement according to the invention synchronizes a clock system to a high-speed input data stream and can be used e.g. when high-speed synchronous data is to be sent between two circuits.

BRIEF DESCRIPTION OF THE DRAWING

The invention will be described more in detail below with reference to the appended drawing on which

DESCRIPTION OF THE INVENTION

Figure 1:
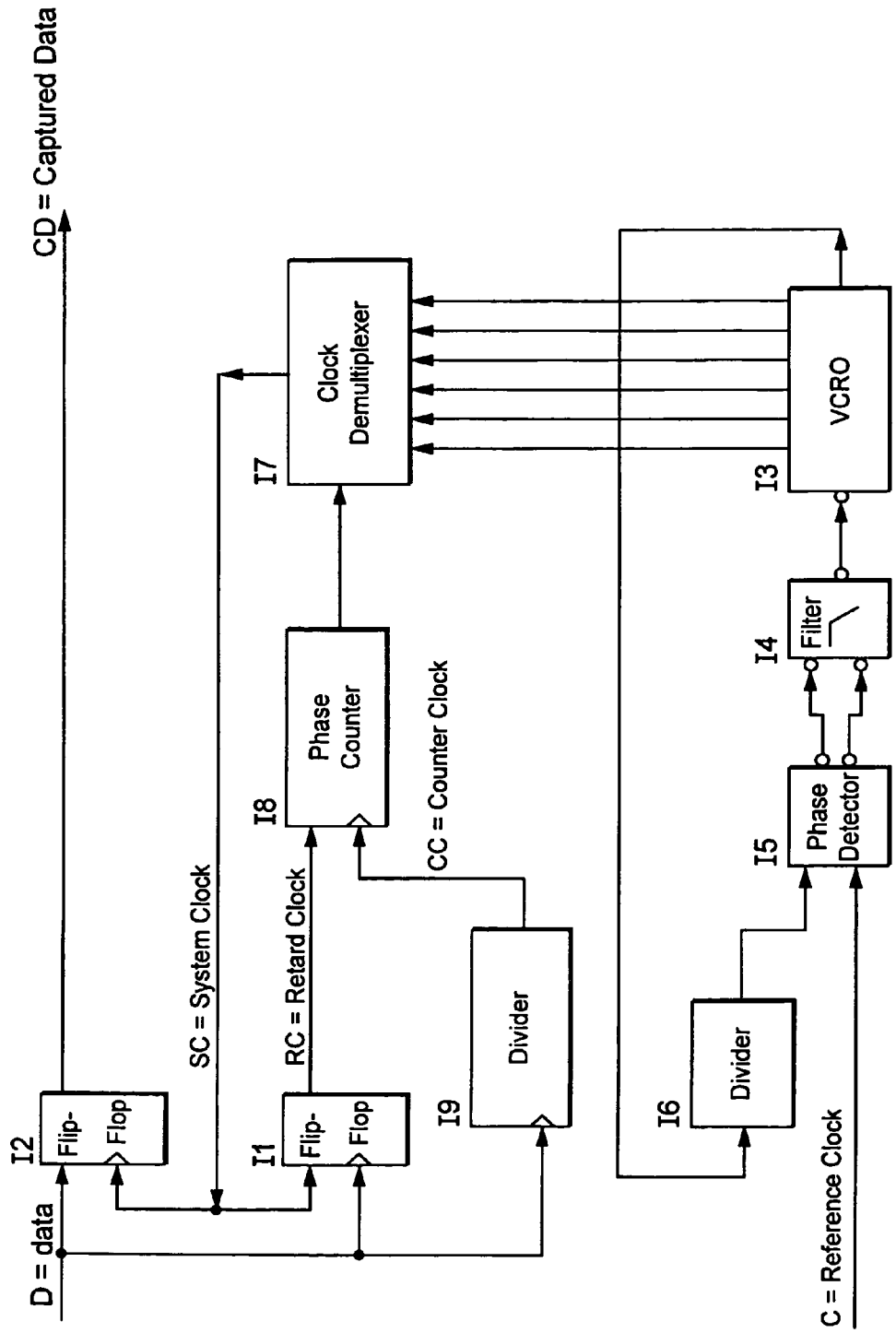
FIG. 1 is a block diagram of an embodiment of an arrangement according to the invention.
Figure 2:
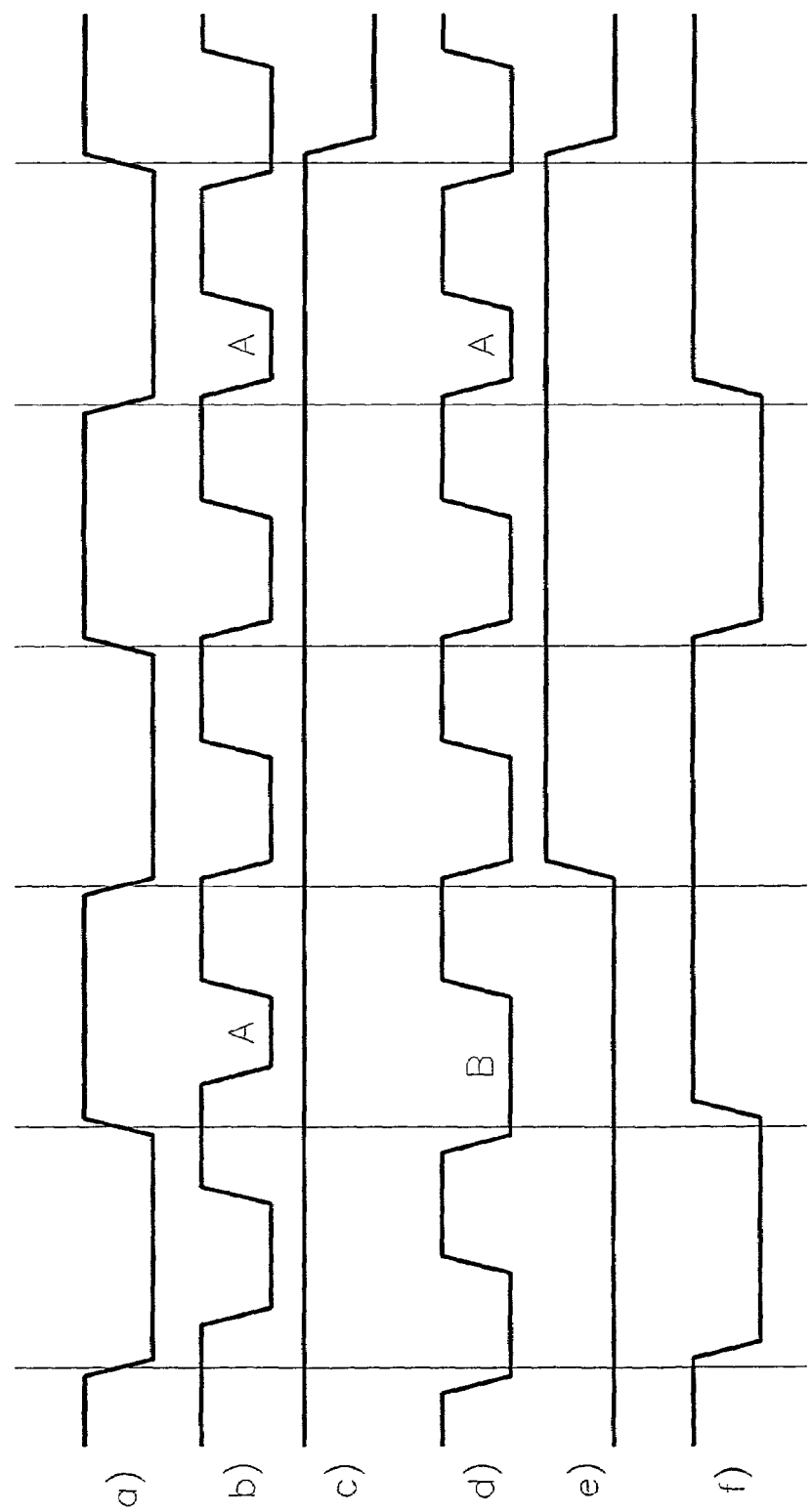
FIGS. 2a–f are pulse diagrams showing the arrangement in FIG. 1 going into lock mode from various conditions.

In the embodiment illustrated in FIG. 1, a stream of data D to be captured is received on an input connected to the data input of a flip-flop I2. The data stream at the input is shown in FIG. 2a. The incoming data D is illustrated to have a '1010 . . . ' pattern in this embodiment as apparent from FIG. 2a.

Below, the description of the embodiment in FIG. 1 is divided into three sections, namely multi-phase clock generation, system clock adjustment, and clock demultiplexer control.

Multi-phase Clock Generation

To capture the incoming data by means of the flip-flop I2, a reference clock C is provided to generate clock pulses either at the data transfer rate, i.e. the pulse rate of the incoming data D, or at a sub-multiple thereof.

The reference clock C is connected to a symmetrical multi-phase clock generator that in the embodiment in FIG. 1 is comprised of a voltage controlled ring oscillator (VCRO) I3 with seven stages. Generally, the VCRO I3 can have any number n of stages. The number of stages is chosen to give a suitable resolution.

The VCRO I3 is designed to generate pulses at a pulse rate corresponding to the pulse rate of the incoming data through being adjusted by the reference clock C as described below.

The stages of the VCRO I3 consist of identical voltage controlled delay elements. Each delay element in the VCRO I3 is tapped, whereby seven different clock phases are provided, each subsequent phase shifted from the previous phase by 360°/7.

If the pulse rate of the reference clock C is a sub-multiple of the required clock rate, then a divider I6 is interconnected in the feedback loop from the VCRO I3 to the phase detector I5 to get the correct pulse rate for the VCRO I3 in the conventional manner.

A phase comparator I5 and a filter I4 are interconnected between the clock C and the VCRO I3 to lock the pulse rate of the VCRO I3 to the pulse rate of the reference clock C or to a multiple thereof in the conventional manner.

The taps of the VCRO I3 are connected to a phase selector in the form of a clock demultiplexer I7 in FIG. 1 that is adapted to pick one of these seven phases to be the system clock signal SC shown in FIGS. 2b and 2d.

Any phase delays in the generation of the system clock pulses SC to this point are not important to the system performance. The only requirement is that the system clock can generate pulses at the required pulse rate.

System Clock Adjustment

In accordance with the invention, the system clock signal SC in FIG. 2b or 2d is controlled such that its negative transition occurs on a data transition. The positive transition of the system clock pulse is used to clock the data into the data flip-flop I2. This gives maximum set-up and hold times for the data flip-flop I2 within the resolution of the VCRO I3.

A dual edge triggered flip-flop I1 is provided to sample the system clock signal SC in FIG. 2b or 2d on each transition of the incoming data D.

Depending if the system clock signal SC is high or low when a data transition occurs, a retard clock signal RC shown in FIGS. 2c and 2e as outputted by the flip-flop I1 becomes high (system clock signal is high) or low (system clock signal is low) when a data transition occurs.

In the embodiment in FIG. 1, a divider I9 is provided to generate a counter clock signal CC on every third data transition as shown in FIG. 2f. This signal CC is used to clock a phase counter I8 that in this embodiment is a modulo 7 up/down counter.

Every third data transition is used in order to allow the clock loop to settle before it is subsequently adjusted. The third transition is unimportant, the number could be two or higher. However using an odd number allows any mismatch between odd and even data transitions to be averaged out.

Thus, in the embodiment in FIG. 1, the up/down counter I8 counts up or down on every third data transition, depending if the retard clock signal RC is high (count down) or low (count up).

The output signal of the up/down counter I8 controls the clock demultiplexer I7 as described later.

The incoming data D is continuously sampled by the data flip-flop I2 on the positive transition of the system clock signal SC.

The captured data CD (not shown) that is outputted by the flip-flop I2 is now synchronized to the system clock and is ready for use in the rest of the system.

The final "locked" position of the arrangement in FIG. 1 is that the negative transition of the system clock signal SC comes just before or just after a data transition. Within the resolution of the VCRO I3, this will give maximum set-up and hold times for the data flip-flop I2.

The arrangement according to the invention can be used to synchronize a clock system to a high-speed input data stream. It can be used when high-speed synchronous data is to be sent between two circuits. The speed of the data channel and the delay in the transmission medium make it impractical to use conventional synchronous techniques.

A reference clock pulse rate, which is the same as the data transfer rate or is a sub-multiple thereof, must be available at both the transmitter and the receiver.

The performance of this circuit depends only on the matching of the set-up and hold characteristics between the two flip-flops I1 and I2. This matching can be very well controlled. All other delays in the system are unimportant providing they meet the pulse rate requirement. The system locks after only a few data bits have been sent and thereafter does not depend on the content of the data being sent or on a particular data pattern to remain in lock. The system remains in lock even when no data is sent providing the transmitter and receiver clocks remain the same.

Clock Demultiplexer Control

For the sake of simplicity, the data D in FIG. 2a is shown to have a transition every cycle. If this is not the case, the counter clock signal cycle is extended and no modification takes place to the system clock signal SC until three data transitions have occurred.

FIGS. 2b and 2c, illustrating the system clock signal SC and the retard clock signal RC, respectively, show what takes place when the system is trying to synchronize.

In this case, the system clock signal SC is too advanced. Consequently, the retard clock signal RC is high and on the positive edge of the counter clock signal CC, the clock phase counter I8 counts down. In its turn, the clock demultiplexer I7 is controlled to choose an earlier clock phase from the VCRO I3.

This is illustrated by the shortened system clock pulse denoted A in FIG. 2b.

The same thing happens at the next positive edge of the counter clock signal CC and the clock phase counter I8 again counts down.

When the system clock phase eventually becomes too retarded with respect to the incoming data, the retard clock signal RC goes low and the clock phase counter I8 counts up as illustrated by the lengthened system clock pulse denoted B in FIG. 2d.

FIGS. 2d and 2e, illustrating the system clock signal SC and the retard clock signal RC, respectively, show what takes place when the system is in synchronization. The change of state of the clock phase counter I8 alternatively increases and reduces the system clock pulse length as indicated by a pulses B and A, respectively.

What is claimed is:

1. An arrangement for capturing data from a data stream of a predetermined data transfer rate, comprising:
    a first flip-flop that is adapted to receive the data stream on its data input and a system clock signal on its clock input for clocking captured data to its output,
    a symmetrical multiphase clock generator that is adapted to be locked to a reference clock which in turn is adapted to generate a reference clock signal at the data transfer rate or at a fraction thereof, the multiphase clock generator being adapted to generate n clock signals mutually shifted in phase 360°/n from each other, where n is an integer, and
    a selector that is connected with its input to the multiphase clock generator to receive the n clock signals, the selector being adapted to select, in response to a control signal, one of these n clock signals to be the system clock signal to be supplied to the clock input of the first flip-flop, wherein
    a dual edge triggered second flip-flop is connected with its data input to the clock input of the first flip-flop and with its clock input to the data input of the first flip-flop to sample the selected system clock signal by means of the incoming data stream on every data transition thereof to generate on its output a retard clock signal that is high if the selected system clock signal is high when sampled and that is low if the selected system clock signal is low when sampled,
    a divider is connected with its input to the data input of the first flip-flop and is adapted to generate a counter clock signal on its output every time a predetermined number of data transitions has occurred in the data stream, and
    a clock phase counter is connected with its input to the output of the dual edge triggered second flip-flop, with its clock input to the output of the divider, and with its output to the selector to control the selector to select another one of said n clock signals to be the system clock signal in response to the retard clock signal being high or low.

2. The arrangement according to claim 1, characterized in that said predetermined number is $\geq 2$.

* * * * *